United States Patent [19]

Gelorme et al.

[11] Patent Number: 5,041,470

[45] Date of Patent: Aug. 20, 1991

[54] FLAME RETARDANT PHOTOCURABLE ADHESIVE FOR WIRES AND CIRCUIT BOARDS

[75] Inventors: Jeffrey D. Gelorme; Eugene R. Skarvinko, both of Binghamton, N.Y.

[73] Assignee: International Business Machines Corporation, Armonk, N.Y.

[21] Appl. No.: 318,208

[22] Filed: Mar. 3, 1989

[51] Int. Cl.$^5$ .................. C08F 2/50; C08F 20/20; C08G 59/17; C08G 65/28

[52] U.S. Cl. ..................... 522/44; 522/79; 522/83; 522/103

[58] Field of Search ............ 522/103, 44, 79, 83

[56] References Cited

U.S. PATENT DOCUMENTS

| | | | |
|---|---|---|---|
| 4,237,216 | 12/1980 | Skarvinko | 522/103 |
| 4,311,749 | 1/1982 | Hiraiwa et al. | 428/209 |
| 4,317,858 | 3/1982 | Sattler | 522/103 |
| 4,407,883 | 10/1983 | Newton | 428/215 |
| 4,444,806 | 4/1984 | Morgan et al. | 427/45.1 |
| 4,479,991 | 10/1984 | Thompson | 428/76 |
| 4,550,128 | 10/1985 | Chellis | 523/433 |
| 4,666,954 | 5/1987 | Forgo | 522/103 |
| 4,855,333 | 8/1989 | Rudik | 522/71 |

OTHER PUBLICATIONS

Partial Translation of Japanese Printed Patent Document 136319 of Aug. 4, 1984 (J59136319).
Partial Translation of Japanese Printed Patent Document 66476 of Apr. 14, 1984 (J59066476).

Primary Examiner—Marion E. McCamish
Assistant Examiner—Arthur H. Koeckert
Attorney, Agent, or Firm—Pollock, Vande Sande & Priddy

[57] ABSTRACT

A photocurable adhesive composition comprising a phenoxy resin; a reaction product of an unsaturated carboxylic acid and epoxidized non-linear novolak; reaction product of an unsaturated carboxylic acid and a tetrabrominated diglycidyl ether of a phenol; monohydroxy dipentaerythritol acrylate and/or pentaerythritol tetraacrylate; polyethylenically unsaturated compound; and photoinitiator, and optionally, hexamethylol melamine-formaldehyde; and/or a thixotropic agent; and use thereof.

16 Claims, 1 Drawing Sheet

FLAME RETARDANT PHOTOCURABLE ADHESIVE FOR WIRES AND CIRCUIT BOARDS

DESCRIPTION

1. Technical Field

The present invention is concerned with photocurable adhesive compositions and especially with photocurable adhesive compositions that exhibit flame retardancy. The adhesive compositions of the present invention are especially useful for bonding encapsulated wires to a substrate in the preparation of circuit boards for electronic components.

2. Background Art

The art of making circuit boards is well developed. The technique most widely used to fabricate circuit boards is generally referred to as the "subtractive process". This process begins with a sheet of copper on a substrate. The copper sheet is etched to form a pattern of desired circuit paths. A more advanced technique for fabricating circuit boards is termed the "additive process". The additive process begins with an insulating substrate and adds copper where needed to form the desired circuit lines. One way of practicing the additive process to fabricate circuit boards is described in U.S. Pat. No. 4,030,190.

An alternative way to fabricate circuit boards involves encapsulating insulated wires in an adhesive. The resulting circuit board is generally termed an encapsulated wire circuit board. Encapsulated wire circuit boards are commercially available under the trade name "Multiwire" ® which is owned by the Kollmorgen Corporation. The encapsulated wire technique is discussed in U.S. Pat. Nos. 4,097,684 to Burr, 3,646,772 to Burr, 3,674,914 to Burr, and 3,674,602 to Keough.

U.S. Pat. No. 4,662,963 to Varker, entitled "High Density Encapsulated Wire Circuit Board", describes a technique for making an encapsulated wire circuit board wherein the insulated wires are firmly bonded to a relatively thick layer of copper which is covered by a layer of prepreg. The expansion and contraction of the board during thermal cycling is controlled by the copper and, therefore, there is not any significant amount of unpredictable variations in the dimensions of the board. Holes can be very accurately drilled at precise locations in such boards. In the technique shown in U.S. Pat. No. 4,662,963 to Varker insulated wires are bonded to a substrate utilizing a heat curable adhesive so that, after the adhesive is cured, the wires can not move relative to the substrate.

U.S. Pat. No. 4,427,478, entitled "Process for Making an Encapsulated Circuit Board and Products Made Thereby", by Grant, et al., describes an improvement of the circuit board and process described in U.S. Pat. No. 4,662,963 to Varker. In particular, U.S. Pat. No. 4,427,478 to Grant, et al. describes the fabrication of an encapsulated wire board using a photocurable adhesive material. In the technique described therein the wires are laid in a photocurable adhesive; this adhesive is exposed to light, thereby curing the adhesive and firmly bonding the wires to the substrate. U.S. Pat. No. 4,427,478 to Grant, et al. describes the use of the material disclosed in U.S. Pat. No. 4,169,732 to Shipley as the adhesive.

It was then discovered as disclosed in U.S. Pat. No. 4,544,801 to Rudik, et al. and copending application Ser. No. 035,207, entitled "Circuit Board Including Encapsulated Wires and Method of Making Such a Board", that encapsulated boards could be efficiently fabricated having a high degree of dimensional stability by employing a photo-curable adhesive having a unique combination of rheological properties. In particular, the adhesives therein have the following rheological properties:

1) a Loss Angle Ratio at ambient temperature which is:
   greater than about 0.1 and less than about 1;
2) a Storage Shear Modulus G' at ambient temperature which is:
   greater than about $10^7$ and less than about $10^8$;
3) Storage Shear Modulus G' at temperatures of less than 150° C. which is:
   less than about $10^6$.

The disclosure of application Ser. No. 035,207 to Rudik, et al. is incorporated herein by reference.

SUMMARY OF INVENTION

The adhesives disclosed in U.S. Pat. No. 4,544,801 and Ser. No. 035,207, although quite satisfactory, do not possess the flame resistance needed by the Underwriters Laboratory-Vo Certification. Accordingly, the present invention provides an adhesive composition that possesses the necessary flame resistance properties while still maintaining the unique combination of desirable rheological properties, along with being photosensitive. In particular, the present invention is concerned with a photocurable adhesive comprising:

A) about 21% to about 32% phenoxy resin;
7 5% to about 17.5% by weight of reaction product of monoethylenically unsaturated carboxylic acid and an epoxy polymer being an epoxidized non-linear novolak having at least six terminal epoxy groups, wherein the relative amount of said acid to said epoxy polymer is sufficient to react stoichiometrically with about 80% to about 100% of the epoxide functionality of said epoxy polymer;
C) about 30% to about 36% by weight of reaction product of tetrabrominated diglycidyl ether of a phenol and monoethylenically unsaturated carboxylic acid wherein the relative amount of said acid to said ether is sufficient to react stoichiometrically with about 80% to about 100% of the epoxide functionality of said epoxy polymer;
D) about 9% to about 19.5% by weight of monohydroxy-dipentaerythritol acrylate or pentaerythritol tetraacrylate or mixtures thereof;
E) about 3.5% to about 14% by weight of polyethylenically unsaturated compound;
F) up to about 6.5% by weight of hexamethylol melamine-formaldehyde;
G) about 1% to about 6.5% by weight of photoinitiator; and
H) up to about 10% by weight of a thixotropic agent.

The photocurable adhesive composition of the present invention can be used in the fabrication of encapsulated wire board. For instance, wires can be embedded in the adhesive of the present invention using a conventional wiring apparatus of the type generally shown in U.S. Pat. No. 3,674,602 to Keough. After the wires have been laid in the photocurable adhesive, the adhesive is partially cured by illuminating it with light. Next, the adhesive is thermally cured, either by heat alone or as part of a high temperature laminating step. A conventional drilling operation then follows. The holes are plated and the board is finished in a conventional manner.

In addition, the present invention is concerned with an encapsulated wire circuit board comprising a rigid base plane; a layer of glass epoxy prepreg covering the base plane; a layer of the above-disclosed photocured adhesive covering the epoxy prepreg; and insulated wires encapsulated in the adhesive.

BEST AND VARIOUS MODES FOR CARRYING OUT INVENTION

Figure 1:
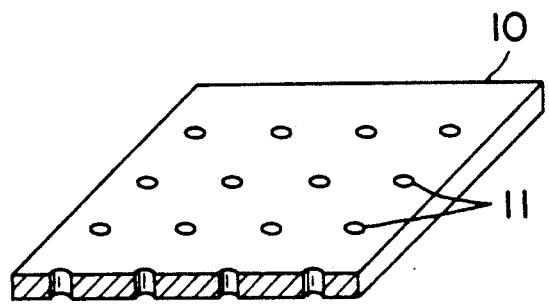
FIG. 1 illustrates a layer of copper foil showing the power clearance holes.

The base element in circuit boards fabricated in accordance with this invention is a layer of copper foil (10) shown in FIG. 1. This can be what is commonly called two ounce copper which has a weight of two ounces per square foot. The circuit board can include one or more such layers. The foil forms a ground or power plane for the circuit board. Holes (11) are drilled in this foil at all locations where connections will be made to the encapsulated wires, except at the locations where connections between the encapsulated wires and the power or ground planes are desired.

Figure 2:
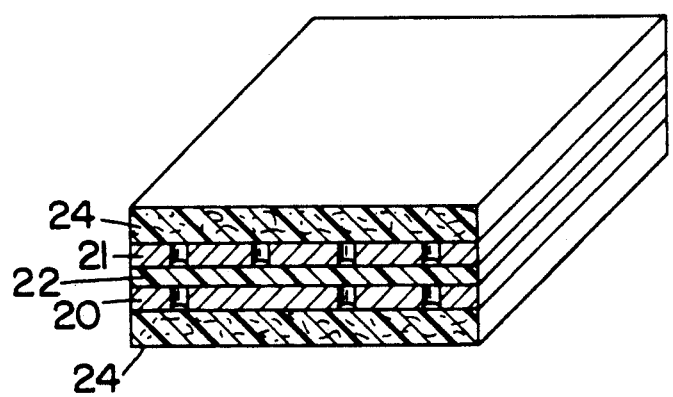
FIG. 2 illustrates a composite containing a plurality of power cores.

The particular embodiment shown here has a power plane (20) and a ground plane (21) in each composite as shown in FIG. 2. Power plane (20) and ground plane (21) are separated by a layer of epoxy resin prepreg (22) covered by layers of epoxy prepreg (23) and (24). Epoxy resin prepreg (22), (23), and (24) is conventional prepreg which consists of glass cloth impregnated with epoxy. The epoxy prepreg can, for example, be formulated as shown in U.S. Pat. No. 4,024,305.

Figure 4:
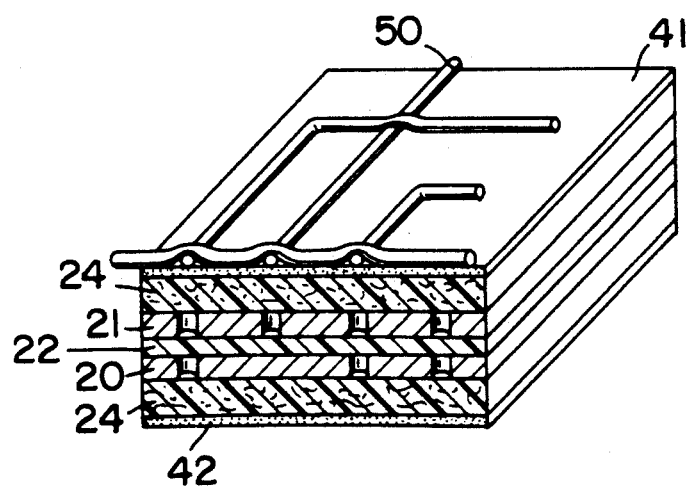
FIG. 4 illustrates a composite with wires applied.

The top and bottom layers of prepreg (23) and (24) are covered with layers of the adhesive of the present invention (41) and (42) as shown in FIG. 4.

The circuit wires (50) are embedded in the adhesive (41) and (42) as shown in FIG. 4. This can be done utilizing the type of equipment marketed by Kollmorgen Corporation for the fabrication of "Multiwire" boards. An example of such machinery is described in U.S. Pat. No. 3,674,914 to Burr.

If a multilayer board is desired, several composites, each of which has wires applied as described above, can be laminated together to form a multilayer board. The number of composites that can be laminated together is among other considerations limited by the ability to accurately drill small holes through the entire assembly.

The compositions of the present invention are flame resistant as well as possessing the following rheological properties measured at a frequency in the range of 1 to 10 cycles per second:

1) a Loss Angle Ratio at ambient temperature which is:
   greater than about 0.1 and less than about 1 and preferably about 0.3 to 0.7;
2) a Storage Shear Modulus G' at ambient temperature which is:
   greater than about $10^7$ and less than about $10^8$ and preferably about $(2 \text{ to } 4) \times 10^7$ (units of G' are dynes/cm$^2$); and
3) a Storage Shear Modulus G' at temperatures of less than 150° C. which is:
   less than about $10^6$.

The phenoxy polymer employed is a relatively high molecular weight polymer having a molecular weight of about 30,000 to about 200,000. The phenoxy polymers are also referred to as thermoplastic polyhydroxy ethers and are generally reaction products of substantially equal molar quantities of a dihydric phenol and epichlorohydrin. The polyhydroxy ethers or phenoxy polymers are substantially free from 1,2-epoxy groups. The molecular weight of these polymers is so high that, for practical purposes, one need not consider their terminal epoxide functionality.

The phenoxy polymers can be represented by the repeating unit:

wherein A is the radical residuum of a polynuclear dihydric phenol and B is a hydroxyl-containing radical residuum of epichlorohydrin; m is the degree of polymerization and generally is at least about 30. The preferred phenoxy polymers are those wherein the dihydric phenol is bisphenol A (i.e., 2,2-bis(p-hydroxy phenyl) propane and can be represented by having the repeating unit:

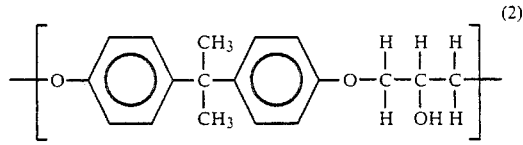

By representation of the above repeating units, it is not intended to be an assertion that the phenoxy polymers have only the configuration of pure linear polymers. For instance, some branching can occur by reaction of epichlorohydrin or dihydric phenol or both, with pendant hydroxyl groups of the growing polyhydroxy ether chain. Accordingly, the representation of the thermoplastic phenoxy polymers in the terms of the repeating unit:

is a useful means for determining stoichiometry and the like, but is not an accurate depiction of structure such as one may obtain from a monomer or a low molecular weight compound.

The phenoxy polymers employed according to the present invention are substantially free from 1,2-epoxy groups as evidenced by the application of the two "epoxide equivalent" analytical tests described in "Epoxy Resins" by A. Lee and K. Neville, pages 21–25, McGraw-Hill, Inc., New York (1957). Examples of some suitable dihydric phenols can be found in U.S. Pat. No. 3,424,707 to Schaufelberger, disclosure of which dihydric phenols is incorporated herein by reference. Mixtures of the phenoxy polymers can be employed if desired.

Some commercially available phenoxy polymers include Eponol 53 ®, Eponol 55 ®, Epon 1009 ®, Phenoxy PAHJ ®, Phenoxy PKHC ®, Phenoxy PKHA ®, and Phenoxy PKHH ®.

The phenoxy polymer is employed in amounts of about 21% to 32%, and preferably about 26% to about 27% by weight of the non-volatile components of the composition.

The reaction products of the monoethylenically unsaturated carboxylic acid and epoxidized non-linear novolak epoxy polymer requires that the relative amount of acid to epoxy polymer be sufficient to react stoichiometrically with about 80% to about 100%, and perferably about 100% of the epoxide functionality of the epoxy polymer.

The acid ia an α,βethylenically unsaturated carboxylic acid. Such are well-known and readily available commercially. Exemplary of such acids are acrylic acid, methacrylic acid, and crotonic acid. The most preferred ethylenically unsaturated carboxylic acid employed is acrylic acid.

The epoxidized novolak employed in the present invention must be a non-linear (e.g., highly branched chain) and must contain at least about six terminal epoxy groups and preferably about eight terminal epoxy groups. Epoxidized novolak polymers are commercially available and can be prepared by known methods by the reaction of a thermoplastic phenolic-aldehyde of a polynuclear dihydric phenol with a halo-epoxy alkane.

The polynuclear dihydric phenol can have the formula:

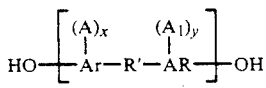

wherein Ar is an aromatic divalent hydrocarbon such as naphthylene and preferably phenylene; A and $A_1$, which can be the same or different, are alkyl radicals preferably having from 1 to 4 carbon atoms, halogen atoms (i.e., fluorine, chlorine, bromine, and iodine) or alkoxy radicals preferably having from 1 to 4 carbon atoms; x and y are integers having a value 0 to a maximum value corresponding to the number of hydrogen atoms on the aromatic radical (Ar) which can be replaced by substituents and $R^1$ is a bond between adjacent carbon atoms as in dihydroxydiphenyl, or is a divalent radical including, for example,

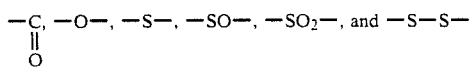

and divalent hydrocarbon radicals such as alkylene, alkylidene, cycloaliphatic (e.g., cycloalkylene and cycloalkylidene) halogenated, alkoxy or raryloxy substituted alkylene, alkylidene and cycloaliphatic radicals, as well as alkarylene and aromatic radicals, including halogenated alkyl, alkoxy, or aryloxy substituted aromatic radicals, and a ring fused to an Ar group; or $R^1$ can be polyalkoxy, or polysiloxy, or two or more alkylidene radicals separated by an aromatic ring, a tertiary amino group, an ether linkage, a carbonyl group, or a sulfur containing group such as sulfoxide, and the like.

Examples of specific dihydric polynuclear phenols include, among others: The bis-(hydroxyphenyl)alkanes such as 2,2-bis-(4-hydroxyphenol)propane, 2,4′-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis-(4-hydroxy-2chlorphenyl)ethane, 1,1-bis(3-methyl-4-hydroxyphenyl) ethane, 1,3-bis-(3-methyl-4-hydroxyphenyl)propane, 2,2-bis -(3-phenyl-4-hydroxyphenyl)propane, 2,2-bis-(3-isopropyl-4-hydroxyphenyl)propane, 2,2-bis(2-isopropyl4-hydroxyphenyl)propane, 2,2-bis(4-hydroxynaphthyl)propane, 2,2-bis-(4-hydroxyphenyl)pentane, 3,3-bis-(4-hydroxyphenyl)pentane, 2,2-bis-(4-hydroxyphenyl)heptane, bis-(4-hydroxyphenyl)phenylmethane, bis-(4-hydroxyphenyl)cyclohexylmethane, 1,2-bis-(4-hydroxyphenyl)-1,2-bis-(phenyl) propane, and 2,2-bis-((4-hydroxyphenyl)-1-phenyl-propane; di(hydroxyphenyl)sulfones such as bis(4-hydroxyphenyl)sulfone, 2,4′-dihydroxydiphenyl sulfone, 5′-chloro-2,4′-dihydroxydiphenyl sulfone, and 5′-chloro-4,4′-dihydroxydiphenyl sulfone; di(hydroxyphenyl) ethers such as bis-(4-hydroxyphenyl)ether, .the 4,3′-, 4,2′-, 2,2′-, 2,3′-, dihydroxydiphenyl ethers, 4,4′-dihydroxy-2,6-dimethyldiphenyl ether, bis-(4bis-(4-hydroxy-3-isopropylphenyl) ether, bis-(4-hydroxy-3-chlorophenyl)ether, bis-(4-hydroxy-3-chloronaphthyl)ether, bis-(2-hydroxydiphenyl) ether, 4,4′-dihydroxy-2,6-dimethoxydiphenyl ether, and 4,4′-dihydroxy-2,5-diethoxydiphenyl ether.

The preferred dihydric polynuclear phenols are represented by the formula:

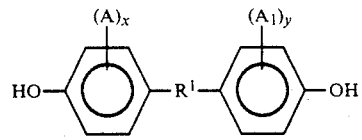

wherein A and $A_1$ are as previously defined, x and y have values from 0 to 4 inclusive, and $R^1$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A (i.e., 2,2-bis(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl.cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution such as the commercially available formalin. The preferred aldehyde is formaldehyde.

The halo-epoxy alkane can be represented by the formula:

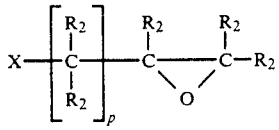

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group totals no more than 10 carbon atoms.

While glycidyl ethers such as derived from epichlorohydrin are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2-epoxybutane, 1-bromo-4-methyl-3,4epoxypentane, 1-bromo-4-ethyl-2,3-epoxypentane, 4-chloro-2-methyl-2,3-epoxypentane, 1-chloro-2,3epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolak employed in the present invention is represented by the average formula:

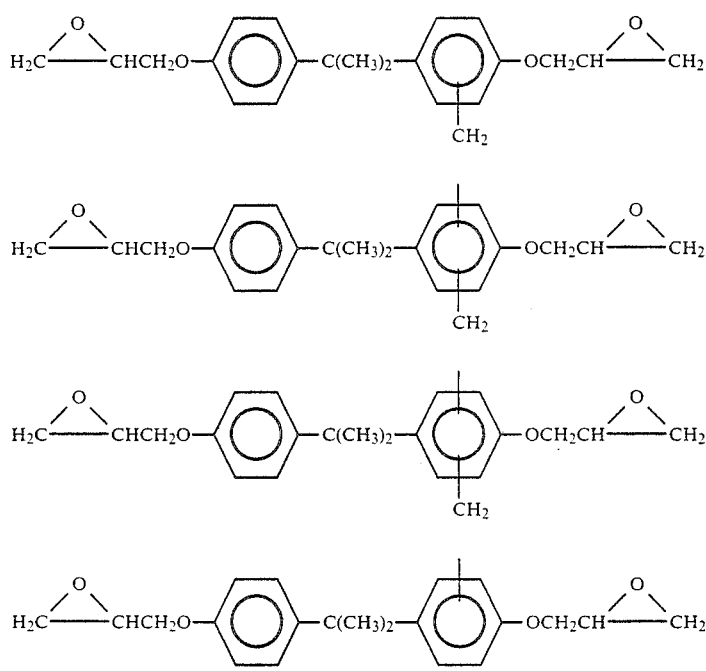

Such is commercially available under the trade designation EPI-REZ SU8 ®.

The conditions for reacting the epoxy and carboxylic acid are well-known and need not be described herein in any great detail. For instance, temperatures of about normal room temperature to about 85° C are suitable. Times of reaction of about 1 hour and up have been found quite adequate. Atmospheric pressures are generally used. However, higher or lower pressures can be employed when desired.

The reaction product of the carboxylic acid and epoxidized non-linear novolak is present in amounts of about 7.5% to about 17.5% by weight and preferably about 12% to about 13% by weight of the non-volatile components of the composition.

The compositions of the present invention also contain a reaction product of a tetrabrominated diglycidyl ether of a phenol such as bisphenol-A and monoethylenically unsaturated carboxylic acid.

The reaction product of the monoethylenically unsaturated carboxylic acid and above brominated epoxy requires that the relative amount of acid to brominated epoxy be sufficient to react stoichiometrically with about 80% to about 100% and preferably about 100% of the epoxide functionality of the brominated epoxy polymer.

The acid is a α, β ethylenically unsaturated carboxylic acid. Such is well-known and readily available commercially. Exemplary of such acids are acrylic acid, methacrylic acid, and crotonic acid. The most preferred ethylenically unsaturated carboxylic acid employed is acrylic acid.

The brominated epoxy polymers (i.e.,—tetrabrominated diglycidyl ether of a phenol) are known and commercially available.

Such can be obtained by reacting a brominated bisphenol such as tetrabrominated bisphenol-A with a halo-epoxy alkane. The halo-epoxy alkanes can be represented by the formula:

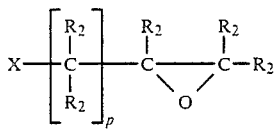

wherein X is a halogen atom (e.g., chlorine and bromine); p is an integer from 1 to 8; each $R_2$ individually is a hydrogen or alkyl group of up to 7 carbon atoms; wherein the number of carbon atoms in any epoxy alkyl group totals no more than 10 carbon atoms. The preferred haloepoxy alkane is epichlorohydrin.

The preferred brominated epoxy polymers have an epoxy equivalent of about 200 to about 220.

The conditions for reacting the epoxy and carboxylic acid are well-known and need not be described herein in any great detail. For instance, temperatures of about normal room temperature to about 85° C are suitable. Times of reaction of about 1 hour and up have been found quite adequate. Atmospheric pressures are generally used. However, higher or lower pressures can be employed when desired.

The reaction product of the carboxylic acid and brominated epoxy polymer is present in amounts of about 30% to about 36% by weight and preferably about 30% to about 31% by weight of the non-volatile components of the composition.

The compositions of the present invention further include about 9% to about 19.5% by weight and preferably about 14% to about 15% by weight based upon the non-volatiles of monohydroxy-dipentaerythritol pentaacrylate, or pentaerythritol tetraacrylate, or mixtures thereof.

Also included in the compositions of the present invention is about 3.5% to about 14% by weight and preferably about 8% to about 9% by weight based upon the non-volatiles of a polyethylenically unsaturated compound capable of reacting upon exposure to ultraviolet light. The preferred polyethylenically unsaturated compound being trimethylolpropane triacrylate.

Other polyethylenically unsaturated compounds include unsaturated esters of polyols and especially esters of the methylene carboxylic acid such as ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; 1,3-propane diol diacrylate; 1,6-hexane diol diacrylate; the bis-acrylates and methacrylates of polyethylene glycols of molecular weight 200–500; trimethylol propane triacrylate; unsaturated amides such as those of the methylene carboxylic acids such as methylene bisacryl and bismethacrylamide; vinyl-esters such as divinyl succinate; divinyl adipate; divinyl phthalate, and divinyl terephthalate, and unsaturate aldehydes such as sorbaldehyde with hydroxyl groups present on the phenoxy polymer.

The compositions of the present invention must contain about 1% to about 6.5% by weight and preferably about 1% to about 2% by weight based upon the nonvolatiles of a photoinitiator. Suitable photoinitiators include benzophenone derivatives such as tetramethyl diaminobenzophenone (Michler's Ketone) and preferably 2,2-dimethoxy-2-phenyl acetophenone (commercially available under the trade designation Irgacure 651 ®).

The compositions of the present invention can also contain up to about 10% by weight and preferably about 4% to about 6% by weight based upon the nonvolatiles of a thixotropic or thickening agent preferably fumed or colloidal silica.

Colloidal silica is silica having a surface area of about 50 to about 500M-2/gram (determined by the BET nitrogen adsorption material) with particles having diameters from about 5 millimicrons to about 20 millimicrons. Colloidal silica, used according to the present invention, is preferably fused silica gel or fused silicon dioxide as it is sometimes called. In addition, the colloidal silica is often referred to in the art as silica aerogel. Fused silica is obtained by the hydrolysis or combustion of silicon tetrachloride in hydrogen-oxygen furnaces. Examples of some commercially available colloidal silicas include Cab-O-Sil ® and Santocel ®. Carbon black and bentonite clay are other examples of thixotropic agents that may be used.

It may be desirable to include a diluent in the composition to obtain a viscosity that is especially suitable for applying the compositions. The amount of diluent is not critical to the composition and is selected for obtaining the desired consistency for film casting.

An amount of diluent sufficient to obtain a viscosity in the range of about 1000 to 2200 centipoise has been found to be satisfactory for film casting.

For instance, the adhesive material can be applied to a film carrier which is laminated to the circuit board and then the carrier is removed.

Alternatively, the adhesive could be sprayed onto the circuit board or it could be applied by a knife coating technique. If spraying is used, an amount of diluent sufficient to obtain a viscosity up to about 1000 centipoise should be used. If knife edge coating is used, an amount of diluent sufficient to obtain a viscosity of above about 2200 centipoise should be used.

The preferred diluent includes the ketones such as methyl ethyl ketone and methyl isobutyl ketone. Examples of other diluents which can be used are 2-ethoxyethylacetate (available under the trade name Cellosolve Acetate ®), 2-(2-butoxyethoxy) ethanol (available under the trade name Butyl Carbitol ®), methyl cellosolve acetate (methoxyethyl acetate), ethyl cellosolve acetate (ethyoxyethyl acetate), propyl cellosolve acetate (propoxyethyl acetate), butyl cellosolve acetate (butoxyethyl acetate), butyl carbitol (2-(2-butoxyethoxy) ethanol), diethyl carbitol (bis(2-ethoxy ethyl) ether), and methylene chloride-methanol (azeotrope).

The composition can, but does not necessarily, contain auxiliary agents such as storage stabilizers and surfactants. For example, the composition can include:

Benzoquinone: This compound provides shelf life. It has the effect of inhibiting polymerization during storage. It is not required for the practice of this invention.

FC 430: This is a surfactant to enhance coating the film to make it smoother. It is not required to practice the invention.

The following non-limiting example is presented to further illustrate the present invention:

EXAMPLE

A composition containing the following constituents and amounts is obtained by mixing in a planetary mixer the following:

1. about 207.82 parts by weight of a 30% solution in methyl ethyl ketone of PKHC ® phenoxy polymer;
2. about 36.51 parts by weight of an 80% solution in methyl isobutyl ketone of a reaction product of EPI-REZ SU8 ® and acrylic acid;
3. about 87.66 parts by weight of an 80% solution in methyl isobutyl ketone of reaction product of acrylic acid and tetrabrominated diglycidyl ether of bisphenol-A having an epoxy equivalent of about 200 to about 220;
4. about 33.11 parts by weight of monohydroxy dipentaerythritol penta acrylate (available as SR 399 ® from Sartomer);
5. about 20.12 parts by weight of trimethylol propane triacrylate;
6. about 3.24 parts by weight of hexamethylol melamine-formaldehyde (Cymel 303 ®);
7. about 3.1 parts by weight of 2,2-dimethoxy-2-phenyl acetophenone (Irgacure 651 ®);
8. about 11.67 parts by weight of colloidal silica (Cabosil M5 ®); and
9. about 7.74 parts by weight of methyl ethyl ketone.

The resulting composition is coated onto one side of a polyester sheet such as a polyethyleneterephthalate sheet (available under the trade name Mylar ®) and passed through an oven maintained at about 260° F. at a speed of about 10-40 feet/minute (22 feet/minute is preferred). An amount is applied to the film such that the resulting dry films have a thickness of 3 mils.

Figure 3:
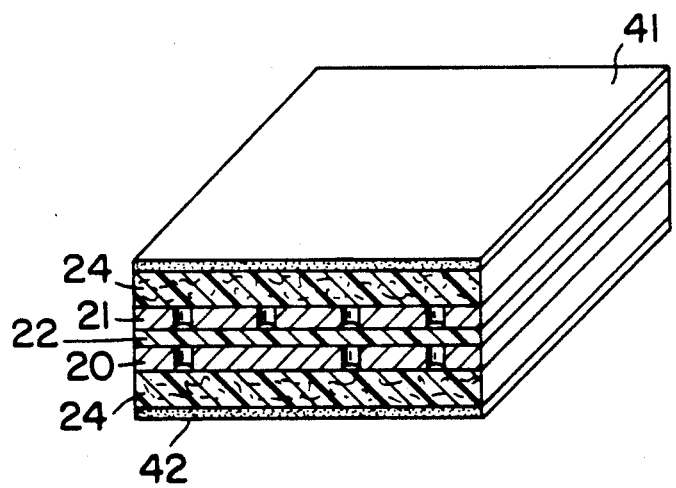
FIG. 3 illustrates a composite including the layers of adhesive.

The coated sheet is applied to a laminate as shown if FIG. 3 The polyethyleneterephthalate is next peeled from the coated composite. Wires are then applied using conventional encapsulated wire techniques. The wiring takes place at an ambient temperature of about 25° C.

After the wiring operation is complete, the wires are pressed further into the adhesive by laminating the composite under a pressure of about 170 psi for about 30 minutes.

The coating is then thoroughly exposed using conventional actinic radiation, for example, using high pressure mercury lamps.

In order to insure that the composite is sufficiently cured, the resulting composite can be post-cured at about 160° C. for about 2 hours. If several composites are laminated together to form a multilayer board, this curing can take place during that lamination operation.

The photocurable flame resistant adhesive of this example has the following properties:

1) The value of its Loss Angle Ratio at ambient temperature is about 0.85.
2) . The value of its Storage Shear Modulus G' at ambient temperature is about $6.5 \times 10^7$.
3) .A Storage Shear Modulus G' at 125° C.; that is, the Storage Shear is about $4 \times 10^5$.

We have illustrated and described the preferred embodiments of the invention; however, it is to be understood that we do not limit ourselves to the precise construction herein disclosed and the right is reserved to all changes and modifications coming within the scope of the invention as defined by the appended claims.

Having thus described our invention, what we claim as new and desire to secure by Letters Patent is:

1. A photocurable adhesive comprising, based upon the non-volatile content of the composition,
A) about 21% to about 32% phenoxy resin;
B) about 7.5% to about 17.5% by weight of reaction product of monoethylenically unsaturated carboxylic acid and an epoxy polymer being an epoxidized non-linear novolak having at least six terminal epoxy groups, wherein the relative amount of said acid to said epoxy polymer is sufficient to react stoichiometrically with about 80% to about 100% of the epoxide functionality of said epoxy polymer;
C) about 30% to about 36% by weight of reaction product of tetrabrominated diglycidyl ether of a phenol and monoethylenically unsaturated carboxylic acid, wherein the relative amount of said acid to said ether is sufficient to react stoichiometrically with about 80% to about 100% of the epoxide functionality of said epoxy polymer;
D) about 9% to about 19.5% by weight of monohydroxydipentaerythritol pentaacrylate, or pentaerythritol tetraacrylate, or mixtures thereof;
E) about 3.5% to about 14% by weight of polyethylenically unsaturated compound selected from the group consisting of diacrylates of diols, dimethacrylates of diols, triacrylates of triols, trimethacrylates of triols, methylene bisacrylamide, methylene bismethacrylamide, divinyl succinate; divinyl adipate; divinyl phthalate, divinyl terephthalate, and the reaction product of sorbaldehyde reacted with hydroxyl groups present on phenoxy polymer;
F) up to about 6.5% by weight of hexamethoxymethyl melamine;
G) about 1% to about 6.5% by weight of photoinitiator; and
H) up to about 10% by weight of a thixotropic agent.

2. The adhesive of claim 1 wherein the amount of A) is about 26% to about 27% by weight; B) is about 12% to about 13% by weight; C) is about 30% to about 31% by weight; D) is about 14% to about 15% by weight; E) is about 8% to about 9% by weight; F) is about 1% to about 2% by weight; G) is about 1% to about 2% by weight; and H) is about 4% to about 6% by weight.

3. The adhesive of claim 1 wherein said epoxidized non-linear novolak has the average formula:

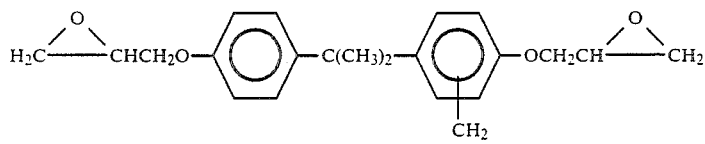

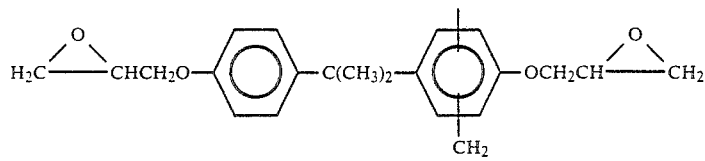

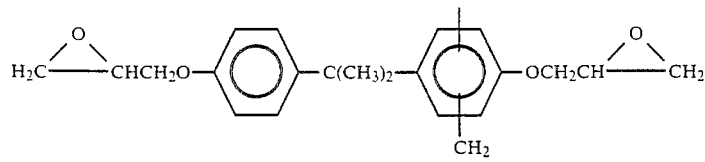

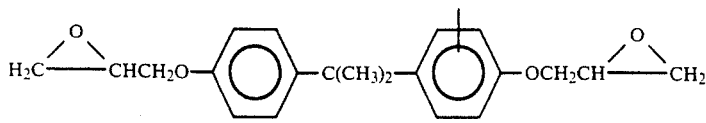

4. The adhesive of claim 1 wherein said tetrabrominated diglycidyl ether is of bisphenol A and has an epoxy equivalent of about 200 to about 220.

5. The adhesive of claim 1 wherein D) is monohydroxydipentaerythritolpentaacrylate.

6. The adhesive of claim 1 wherein said polyethylenically unsaturated compound is trimethylolpropane triacrylate.

7. The adhesive of claim 1 wherein said photoinitiator is 2,2-dimethoxy-2-phenyl acetophenone.

8. The adhesive of claim 1 wherein said thixotropic agent is colloidal silica.

9. The adhesive of claim 1 which further includes a diluent.

10. The adhesive of claim 9 wherein said diluent includes at least one ketone.

11. The adhesive of claim 9 wherein said diluent is a mixture of methyl ethyl ketone and methyl isobutyl ketone.

12. The adhesive of claim 3 wherein said tetrabrominated diglycidyl ether is of bisphenol A and has an epoxy equivalent of about 200 to about 220; D) is monohydroxy-dipentaerythritolpentaacrylte; said polyethylenically unsaturated compound is trimethylol propane triacrylate; said photoinitiator is 2,2-dimethoxy-2-phenyl acetophenone; and said thixotropic agent is colloidal silica.

13. The adhesive of claim 12 wherein the amount of A) is about 26% to about 27% by weight; B) is about 12% to about 13% by weight; C) is about 30% to about 31% by weight; D) is about 14% to about 15% by weight; E) is about 8% to about 9% by weight; F) is about 1% to about 2% by weight; G) is about 1% to about 2% by weight; and H) is about 4% to about 6% by weight.

14. The adhesive of claim 9 which further includes a diluent.

15. The adhesive of claim 11 wherein said diluent is a mixture of methyl ethyl ketone and methyl isobutyl ketone.

16. The adhesive of claim 1 wherein said polyethylenically unsaturated compound is selected from the group consisting of ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; 1,3-propane diol diacrylate; 1,6-hexane diol diacrylate; the bis-acrylates and methacrylates of polyethylene glycols of molecular weight 200-500; trimethylol propane triacrylate; methylene bisacryl and bismethacrylamide; divinyl succinate; divinyl adipate; divinyl phthalate, divinyl terephthalate, and the reaction product of sorbaldehyde reacted with hydroxyl groups present on phenoxy polymer.

* * * * *